(12) United States Patent
Yohe et al.

(10) Patent No.: US 7,743,102 B1
(45) Date of Patent: Jun. 22, 2010

(54) SYSTEM FOR SELECTIVELY AND AUTOMATICALLY COMPRESSING AND DECOMPRESSING DATA AND ENABLING COMPRESSED DATA TO BE RENDERED IN A PSEUDO-NATIVE FORM

(75) Inventors: Thomas P. Yohe, Dayton, OH (US); Donald E. Wood, Austin, TX (US)

(73) Assignee: Stampede Technologies, Inc., Dayton, OH (US)

( * ) Notice: Subject to any disclaimer, the term of this patent is extended or adjusted under 35 U.S.C. 154(b) by 1041 days.

(21) Appl. No.: 10/295,410

(22) Filed: Nov. 15, 2002

(51) Int. Cl.
G06F 15/16 (2006.01)
(52) U.S. Cl. ................................ 709/206; 709/247
(58) Field of Classification Search ................ 709/206, 709/247; 708/203; 707/101, 205
See application file for complete search history.

(56) References Cited

U.S. PATENT DOCUMENTS

| | | | |
|---|---|---|---|
| 5,771,355 A * | 6/1998 | Kuzma | 709/232 |
| 5,923,846 A * | 7/1999 | Gage et al. | 709/213 |
| 6,253,229 B1 | 6/2001 | Nielsen et al. | |
| 6,356,937 B1 * | 3/2002 | Montville et al. | 709/206 |
| 6,385,656 B1 | 5/2002 | Appelman | |
| 6,427,149 B1 | 7/2002 | Rodriguez et al. | |
| 6,449,658 B1 | 9/2002 | Lafe et al. | |
| 6,453,363 B1 | 9/2002 | Slivka et al. | |
| 6,546,417 B1 * | 4/2003 | Baker | 709/206 |
| 6,842,768 B1 * | 1/2005 | Shaffer et al. | 709/203 |
| 7,023,974 B1 * | 4/2006 | Brannam et al. | 379/93.24 |
| 2002/0056010 A1 * | 5/2002 | Lincoln et al. | 709/247 |
| 2002/0091776 A1 * | 7/2002 | Nolan et al. | 709/206 |
| 2002/0120639 A1 * | 8/2002 | Basin et al. | 707/204 |
| 2002/0143792 A1 * | 10/2002 | Belu | 707/200 |
| 2003/0028606 A1 * | 2/2003 | Koopmans et al. | 709/206 |
| 2003/0208546 A1 * | 11/2003 | DeSalvo et al. | 709/206 |
| 2005/0044158 A1 * | 2/2005 | Malik | 709/206 |

OTHER PUBLICATIONS

Screenshots of WinZip 7.0 (SR-1), 1998.*

* cited by examiner

*Primary Examiner*—Thu Nguyen
*Assistant Examiner*—Julian Chang
(74) *Attorney, Agent, or Firm*—R. William Graham

(57) ABSTRACT

A system for selectively and automatically compressing and decompressing data in a manner such that the data file can be rendered in a pseudo-native form and such that a rendering application program can be invoked by the system includes a first computer-based device having software thereon for determining whether a data file is one of a native uncompressed form and compressed form upon one of attaching, detaching, receiving, rendering and accessing the data file. Software compresses the native uncompressed form of the data into an attachment, and software for enhancingly renders the attachment to a viewer in a pseudo-native form, wherein the attachment remains compressed and is rendered to appear as being in a native-uncompressed form.

8 Claims, 8 Drawing Sheets

SYSTEM FOR SELECTIVELY AND AUTOMATICALLY COMPRESSING AND DECOMPRESSING DATA AND ENABLING COMPRESSED DATA TO BE RENDERED IN A PSEUDO-NATIVE FORM

BACKGROUND OF THE INVENTION

1. Field of the Invention

The present invention relates to a system for selectively and automatically compressing data such that it can be edited while viewed in its native form.

2. Related Art

Due to an ever increasing development of software data, hard disk space as well as transmission speed limitations, and accessibility over networks prefer use of data compression technology. Data compression techniques decrease of the size of data, which in turn decreases the time and expense required for transferring the data.

Thus, large data files are typically compressed by the developer or sender of data. A multitude of compression algorithms exist in the marketplace today. Examples include, for instance, LZW (data compression software), available from Unisys Corporation, and LZS, available from Stac Electronics. ZIP (data compression software) compression technology is well known in the industry as PKZIP™ (data compression software), available from PKWARE, Inc., 648 N Plankinton Ave, Suite 220 Milwaukee, Wis.

These compression technologies all function to generate an output which is smaller than the input. The accessor of the data is commonly required to decompress the data upon receiving it. Thus, each compression technique includes a complementary decompression technique which is a program that converts the compressed data file and generates as its output a restored (i.e., uncompressed) version of the original data file.

The commercially available compression/decompression programs have drawbacks. Some techniques require that the compression be run as separate programs apart from the program file or files which have been compressed. A user must run a decompression utility. An accessor of the compressed file must have the complementary software to open the requested file.

Other compression techniques employ self-extracting files. Such is the case with PKZIP™ which includes a separate utility, PK2EXE (executable file), which converts a ZIP file (i.e., a file compressed by PKZIP™) into its original form which, when run by the user, extracts the original file or files which have been compressed. This is performed via an executable file which self extracts or decompresses the file even if the recipient foes not have decompression software. The drawback is that the recipient is unlikely to execute the file as it may be a virus. While these techniques aid reducing time and traffic over a network or Internet, the user is still required to initiate decompression software it in order to edit the file to be accessed and or viewed in its native form.

One existing decompression program is coupled with the archived file to produce a self-extracting file. In that case, the executable program file or files is not compressed within itself, and there is limited ability to pass execution control from the decompression program back to the program file itself which has been compressed. The ability to control the installation process, such as, decompressing or unpacking other files is limited.

En exemplary prior art system 10 includes a conventional computer (CPU) 12 having a central processor 14, random memory 16, permanent memory 18 (e.g., hard or fixed disk, removable floppy disk, optical disk, magneto-optical disk, or flash memory), keyboard 20, a mouse 22 (or like pointing device), a clock 24 and a display or screen device 26.

Processor 14 is operably associated with memory 16 for storing frequently accessed information. One or more input/output device(s) 28, such as a printer can be included. The CPU 12 includes a communication link 30 which can be a LAN, WAN or modem connection, for example.

Operably residing on the CPU 12 is operating software as is known in the art. The operating software 36 is preferably in memory 18, and includes one or more application programs, such as client application software or programs loaded thereon which can execute in a manner as is known in the art. A rendering application (RA) 37, such as MICROSOFT OUTLOOK® (calendaring and e-mail software) or LOTUS NOTES® (calendaring and e-mail software), is typically operably loaded on the CPU 12.

What is needed is a method where the benefits of storing files in compressed format are delivered such that no extra interaction is required by the user in order to access or view the compressed format. Further, it is also needed that the accessor of such a rendered file be able to access the file by using industry standard decompression utilities. With the aid of the present invention, such compressed file is rendered such that the file appears to be in its native form (i.e., a pseudo-native form). The present invention fulfills this and other needs.

BRIEF SUMMARY OF THE INVENTION

It is an object to improve the compression of data.

It is another object to provide a rendering of compressed data in a pseudo-native form.

It is still another object to aid in the transfer and rendering of data.

Accordingly, the present invention is directed to a system for selectively and automatically compressing and decompressing data in a manner such that the data file can be rendered in a pseudo-native form and such that a rendering application program can be invoked by the system. The system includes a first computer-based device having software thereon with means for determining whether data file is one of a native uncompressed form and compressed form upon one of attaching, detaching, receiving, rendering and accessing the data file, means for compressing the native uncompressed form of the data into an attachment, means for enhancingly rendering the attachment to a viewer in a pseudo-native form, wherein the attachment remains compressed and rendered to appear as being in a native-uncompressed form.

The system further includes sender software means for determining whether to send said data file to a second computer-based device in one of a compressed form and native uncompressed form. The sender software determining means includes means for determining whether the second computer-based device is equipped with means for decompressing the attachment.

The compressing means is further characterized to selectively compress the data file upon a compression of the data file resulting in a system savings of a predetermined percentage. The software can be automatically initiated upon composing a data file on said first computer based device. The system of claim 1, wherein said software can be automatically initiated upon composing an e-mail on the first computer based device.

The system further includes means for automatically invoking a rendering application associated with said attachment thereby permitting operations to be performed on the data file subsequent to decompressing the data file. The means automatic invoking means is characterized to be performed transparent to a user. The compression means can compress the data file in a manner to permit opening thereof by an industry standard decompression application program.

Other objects and advantages will be readily apparent to those skilled in the art upon viewing the drawings and reading the detailed description hereafter.

DETAILED DESCRIPTION OF THE INVENTION

Figure 1:
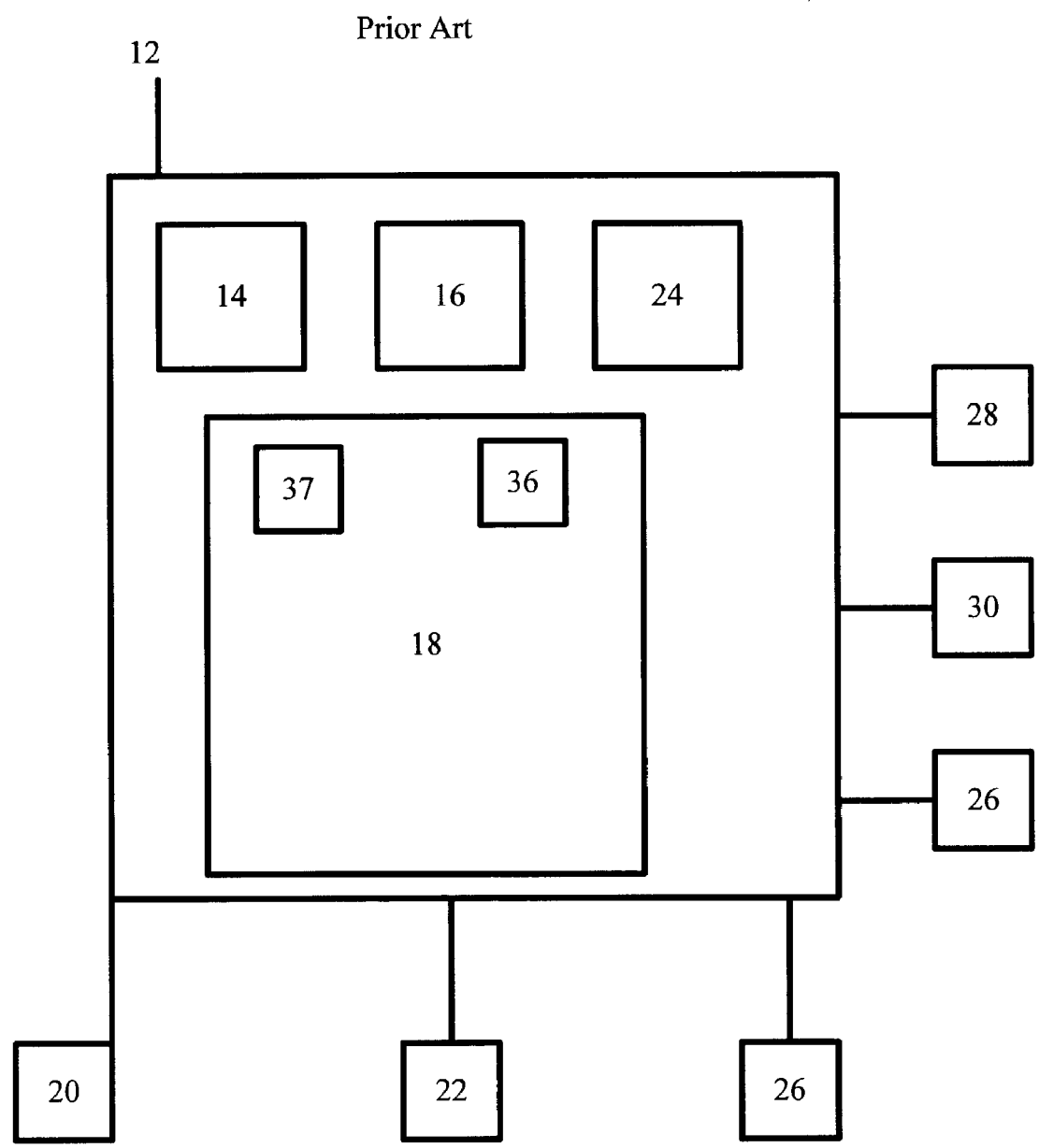
FIG. 1. is a block diagram of the state of the prior art.
Figure 2:
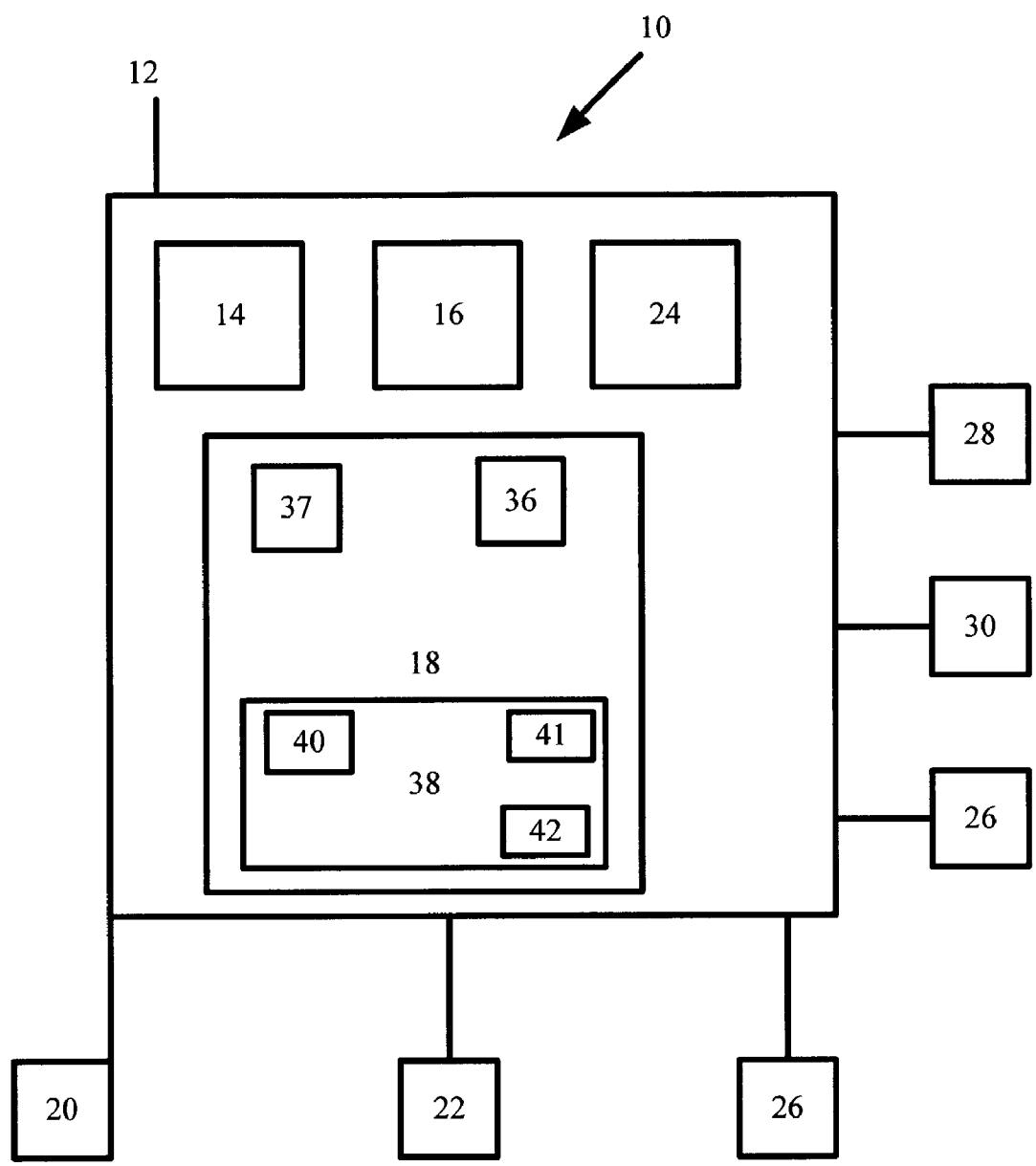
FIG. 2 is a block diagram of the present invention.

Referring now to the drawings, the system of the preferred embodiment of the present invention is generally referred to by the numeral 10. The system 10 includes a CPU and which can include and is capable of running standard operating system such as WINDOWS®, LINUX®, OR UNIX® (operating system software) and rendering applications such as LOTUS NOTES®, web browsers (e.g. INTERNET EXPLORER® and NETSCAPE® (browser software)), email utilities (e.g., OUTLOOK, EUDORA (calendaring and e-mail software)) which graphically depict the presence of an attachment. For purposes of the present invention, an "attachment" is the data which is or is to be compressed. This graphic depiction of an attachment can includes text containing the name of the file attachment and some sort of graphical icon. Some rendering applications also show display a graphical icon that depicts the application software normally associated with the file extension of the name of the file attachment.

The present invention is not intended to limited to any particular architecture, application or particular environment. However, by way of example, the present invention will describe the implementation of the invention in a LOTUS NOTES® environment. Persons skilled in the art will find that the system and methods of the present invention may be advantageously applied to a variety of other systems and application software, including database management systems, e-mail software, word processors, spreadsheets, and the like.

The system 10 includes a conventional computer (CPU) 12 having a central processor 14, random memory 16, permanent memory 18 (e.g., hard or fixed disk, optical disk, magneto-optical disk, or flash memory), keyboard 20, a mouse 22 (or like pointing device), a clock 24 and a display or screen device 26.

Processor 14 is operably associated with memory 16 for storing frequently accessed information. One or more input/output device(s) 28, such as a printer can be included. The CPU 12 includes a communication link 30 which can be a LAN, WAN or modem connection, for example.

Operably residing on the CPU 12 is operating software 36 as is known in the art. The operating software 36 is preferably stored in memory 18, and includes a one or more application programs, such as client application software or programs loaded thereon which can execute in a manner as is known in the art. A rendering application (RA) 37, such as MICROSOFT OUTLOOK® or LOTUS NOTES®, is operably loaded on the CPU 12.

The present invention further provides for automatic compression software (ACP) 38 which is also preferably operably residing on the memory 18 for selectively and automatically compressing data such that it can be edited while viewed in its native form. Here, the operation of ACP 38 will be described in detail below. ACP 38 includes a compression program (CP) 40, decompression program (DP) 41, and rendering enhancing program (REP) 42.

Figure 6:
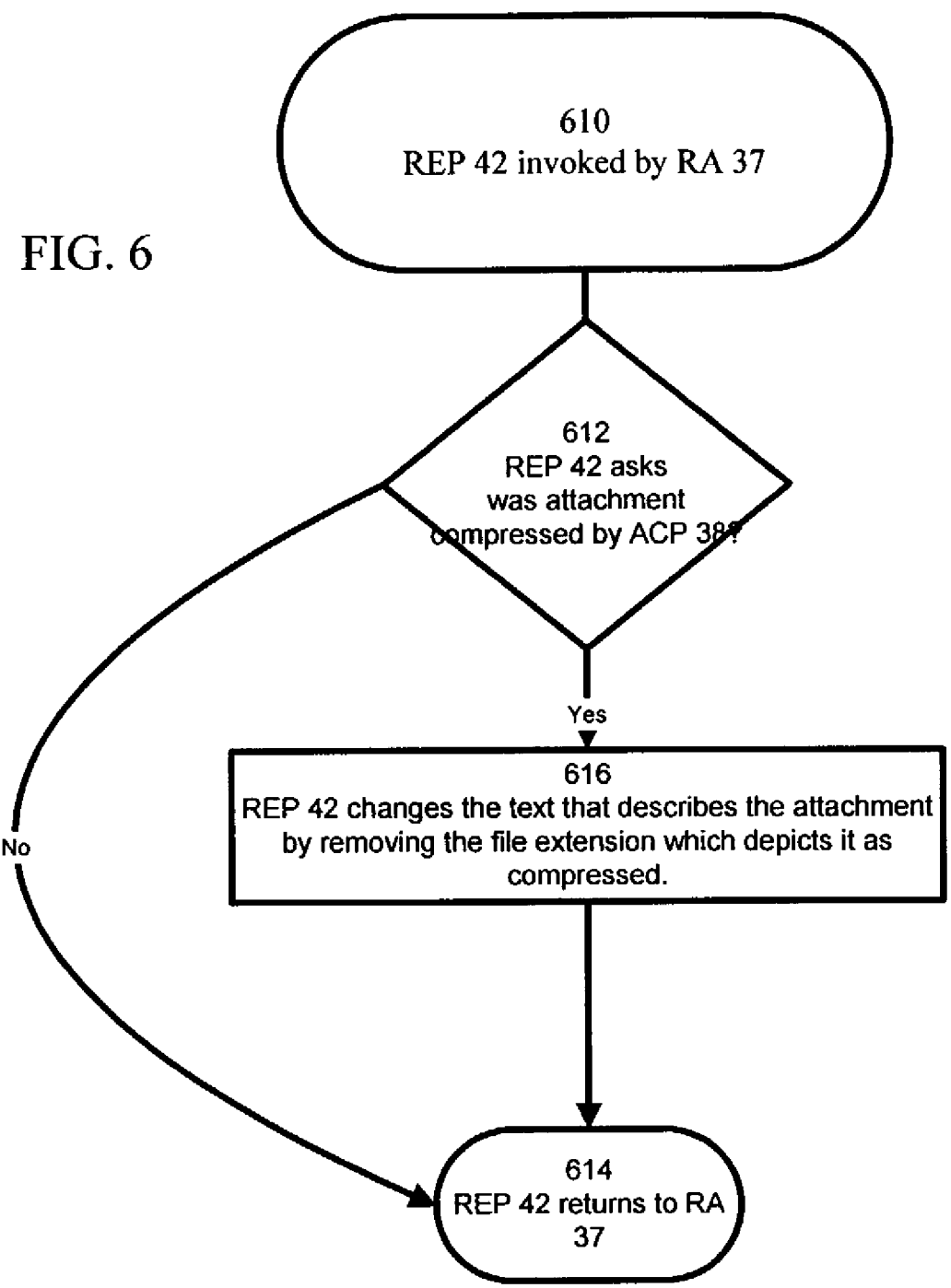
FIG. 6 is a flow chart of another yet operation of the present invention.

The rendering enhancement aspect of this invention is embodied by the flow chart in FIG. 6. This flow chart is accompanied by code and data structures (attached hereto as an Appendix) which represent examples of the detailed logic described generally by the flow chart. The binary representation of a "hotspot" is shown, along with the logic that dynamically changes this binary data if an attachment that is associated with the "hotspot" was compressed by this invention. The software function TgzRemoveTgzipExtensions( ) invokes more detailed logic such as FindHotSpot( ) which in turn invokes TgzLocateTgzippedHotSpot( ) which determines if the hotspot is associated with a compressed attachment, if it is then the function TgzRemoveOneTgzipExtension( ) is invoked to dynamically manipulate the binary data associated with the "hotspot" in order that the user can transparently access the attachment which is actually stored internally as a ".zip" file.

Typically there are 2 ways to compress (or "zip") a file. The first is to store the file in ".zip" format which requires a decompression utility such as PKZIP™ in order to access the files. The second is to make a "self-extractiing" file, which the format of the file is an executable that contains the necessary logic to decompress the compressed file. One of the many drawbacks to a self-extracting file is that it forces the user to execute a program from an untrusted source which can contain viruses. A conventional a self-extracting "zip" file takes as input a file which before compression is uncompressed data (the "Attachment"). Upon compression, the data is translated into a compressed data file.

The internal structure of the attachment is not maintained in a manner which may be used to directly in operation by RA 37. The file is simply a data file, typically comprising a compression dictionary followed by a stream of tokens indicating how dictionary entries are to be employed for reconstructing the original file. In conventional techniques, the attachment yielded is not directly executable by RA 37, rather the attachment must first be decompressed before further use. The contents of the compressed data file are only revealed by conventional decompressing software.

The system 10 of the present invention uses CP 40 to automatically compress the data into an attachment, and REP 42 for rendering the attachment in a manner to permit viewing the file's name and associated logo on the CPU screen as if in its native uncompressed form ("pseudo-native" form is provided). The REP 42 of the software 38 displays the attachment, e.g., file object, as a file having its native extension such as ".doc" or ".jpeg" which will be explained more fully hereinafter.

As used herein, a "document" is a collection of data fields that can then be rendered to a user by a rendering program. Some examples of rendering applications are LOTUS NOTES®, an HTML web browser such as NETSCAPE® OR INTERNET EXPLORER®, MICROSOFT OUTLOOK®. Some examples of documents are email messages which can in turn be displayed by a rendering application. A document can have files associated with it known as attachments. Rendering applications often display the presence of an attachment by displaying an "icon" that is associated with the file extension name of the attachment as well as the file name. As used herein a "database" is a collection of documents.

By way of example, there are three scenarios where ACP 38 is invoked by RA 37:

1. When files are attached to a document, thus creating an attachment;

2. When a document containing an attachment is rendered; and

3. When an attachment is accessed by the user using RA 37.

Some examples of accessing the attachment include viewing the attachment, launching a program associated with an attachment and detaching the attachment as a file.

One of the primary objectives of this invention is to allow REP 42 to portray attachments which have been stored in compressed format as not being in compressed format when the invention is enabled on the computer (CPU 12) on which RA 37 is running. In other words, the invention provides for transparently rendering the attachment to a viewer in a pseudo-native form, wherein the attachment remains compressed and rendered to appear as being in a native-uncompressed form. If the invention is not enabled, then the attachments are compressed by CP 40 such that when they are accessed an industry standard decompression utility (such as WINZIP™, PKZIP™, etc.) can be invoked to access the attachment.

When the invention is enabled, the internal format of the document is dynamically modified so that it can be rendered in such a way that the end user can access the attachment without having to invoke the industry standard decompression utility. This eliminates a tedious step when accessing the attachment while at the same time, providing all the benefits of storing the attachment in a compressed format.

Figure 3:
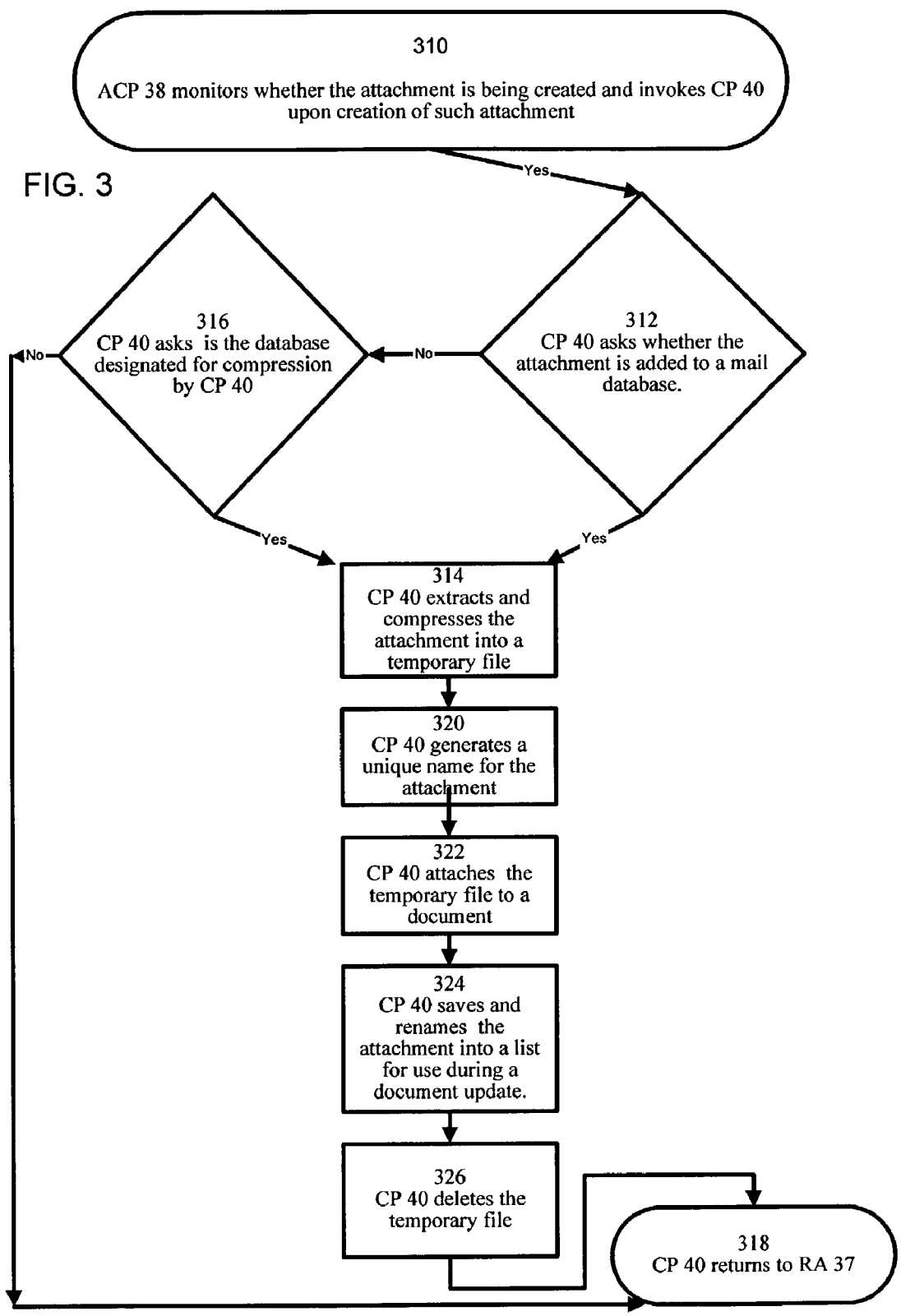
FIG. 3 is a flow chart of another operation of the present invention.
Figure 4:
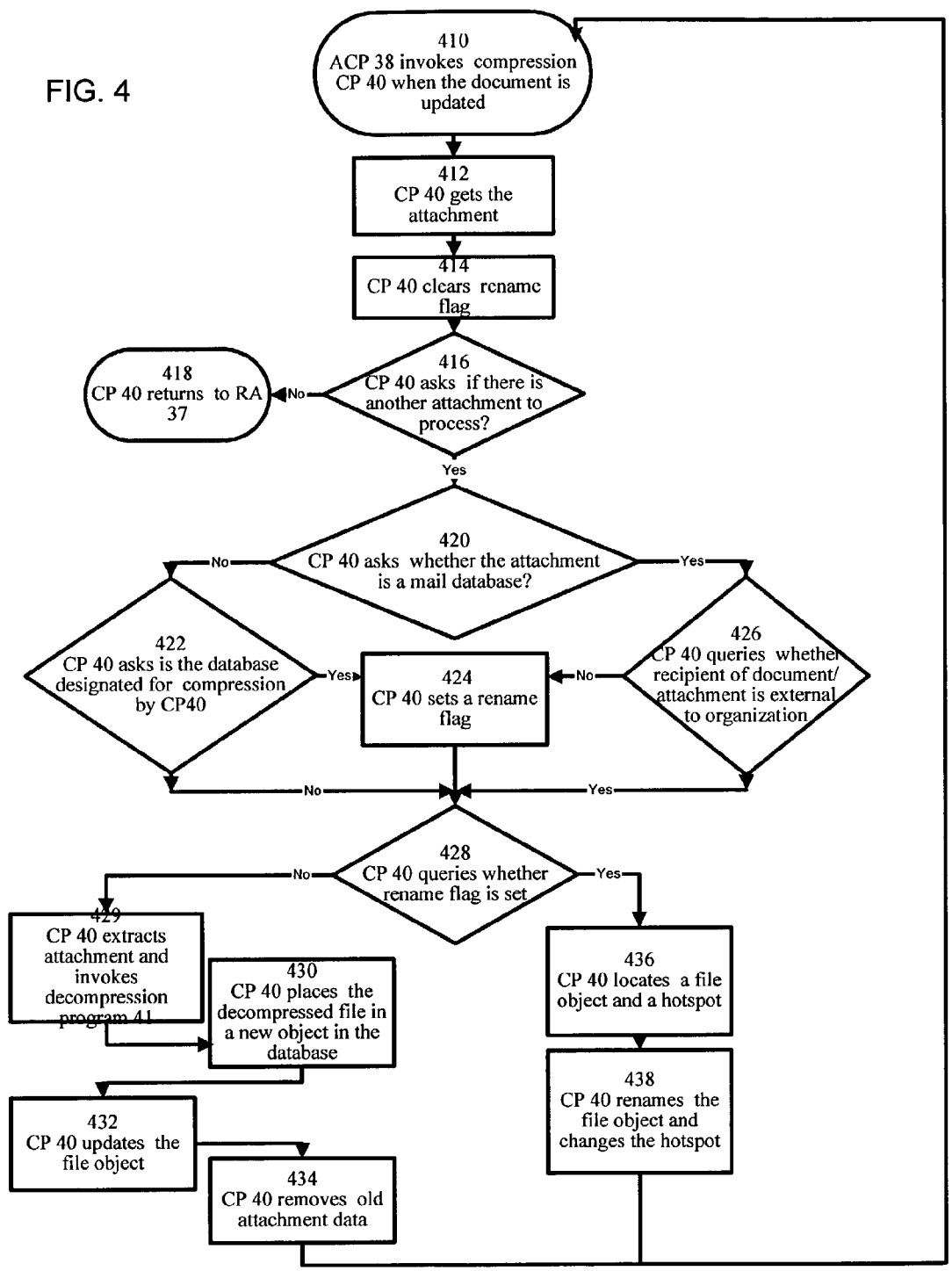
FIG. 4 is a flow chart of still another operation of the present invention.

FIGS. 3-4 depict flow charts of the compression CP 40. ACP 38 monitors 310 whether an attachment is being created to a document and invokes CP 40 upon such creation. CP 40 asks 312 whether the attachment is in a mail database. If yes, CP 40 extracts and compresses 314 the attachment into a temporary file.

If no, CP 40 asks 316 is the database designated for compression by CP 40. If no, the CP 40 returns 318 to RA 37. If yes, CP 40 extracts and compresses 314 the attachment into a temporary file.

CP 40 generates 320 a unique name for the attachment. CP 40 attaches 322 the temporary file to the document. CP 40 saves and renames 324 the attachment into a list for use during a document update. CP 40 deletes 326 the temporary file and returns 318 to RA 37.

FIG. 4 shows a flow chart of showing additional steps performed by compression CP 40 when the document is updated (e.g., e-mailed). ACP 38 invokes 410 CP 40 when the document is updated. The CP 40 gets 412 the Attachment attachment. CP 40 clears 414 rename flag (a rename flag indicates in file a need to rename the file). CP 40 asks 416 if there is another attachment to process? If no, CP 40 returns 418 to RA 37.

If yes, program asks 420 whether the attachment is a mail database? If no, CP 40 asks 422 is the database designated for CP 40. If yes, CP 40 sets 424 a rename flag. If the attachment was for a mail database, CP 40 queries 426 whether a recipient of the document/attachment is external to a predefined organization, i.e., that recipients within the same organization include ACP 38 for purposes of benefiting from the invention. If not, CP 40 sets 424 a rename flag.

CP 40 queries 428 whether rename flag is set. If no, CP 40 extracts 429 attachment and invokes DP 41. CP 40 places 430 the decompressed file in a new object in the database. CP 40 updates 432 the file object and removes 434 the old attachment data. If yes, to query 428, CP 40 locates 436 the file object (i.e., the information data denoting the location of the attachment within a database) and its hotspot (the graphical depiction within the attachment/document which points to the location of the file object within a database, e.g., icon). CP 40 renames 438 the file object and changes the hotspot.

Figure 7:
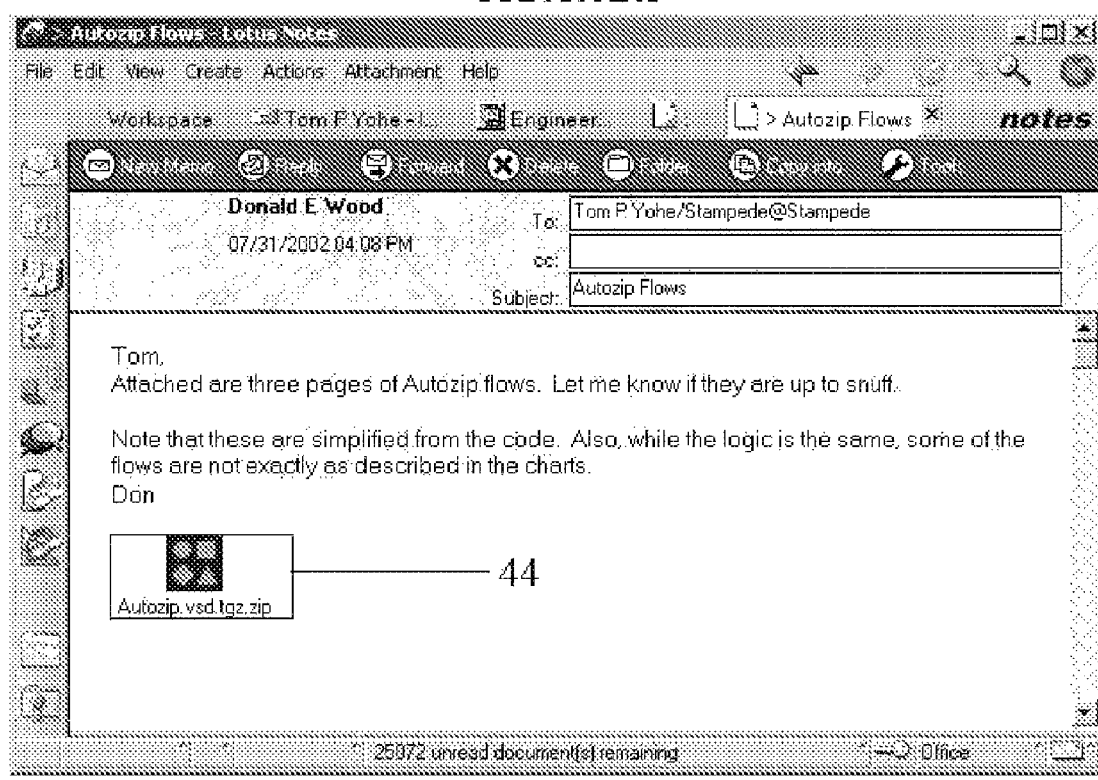
FIG. 7 is a screen shot showing a compressed file as conventionally rendered for view by a user without the aid of the present invention.

FIG. 7 is a screen shot showing a compressed file as conventionally rendered for view by a user without the aid of the software 38. Note, the file 44 is viewed as having an extension "vsd.tgz.zip" which commonly requires the user to initiate decompression software, such as WINZIP™. Subsequent to initiating WINZIP™, the user has to select the file to be decompressed. Then, the user can initiate the program which is associated with opening the unzipped file, e.g., VISIO™. This is burdensome.

Figure 5:
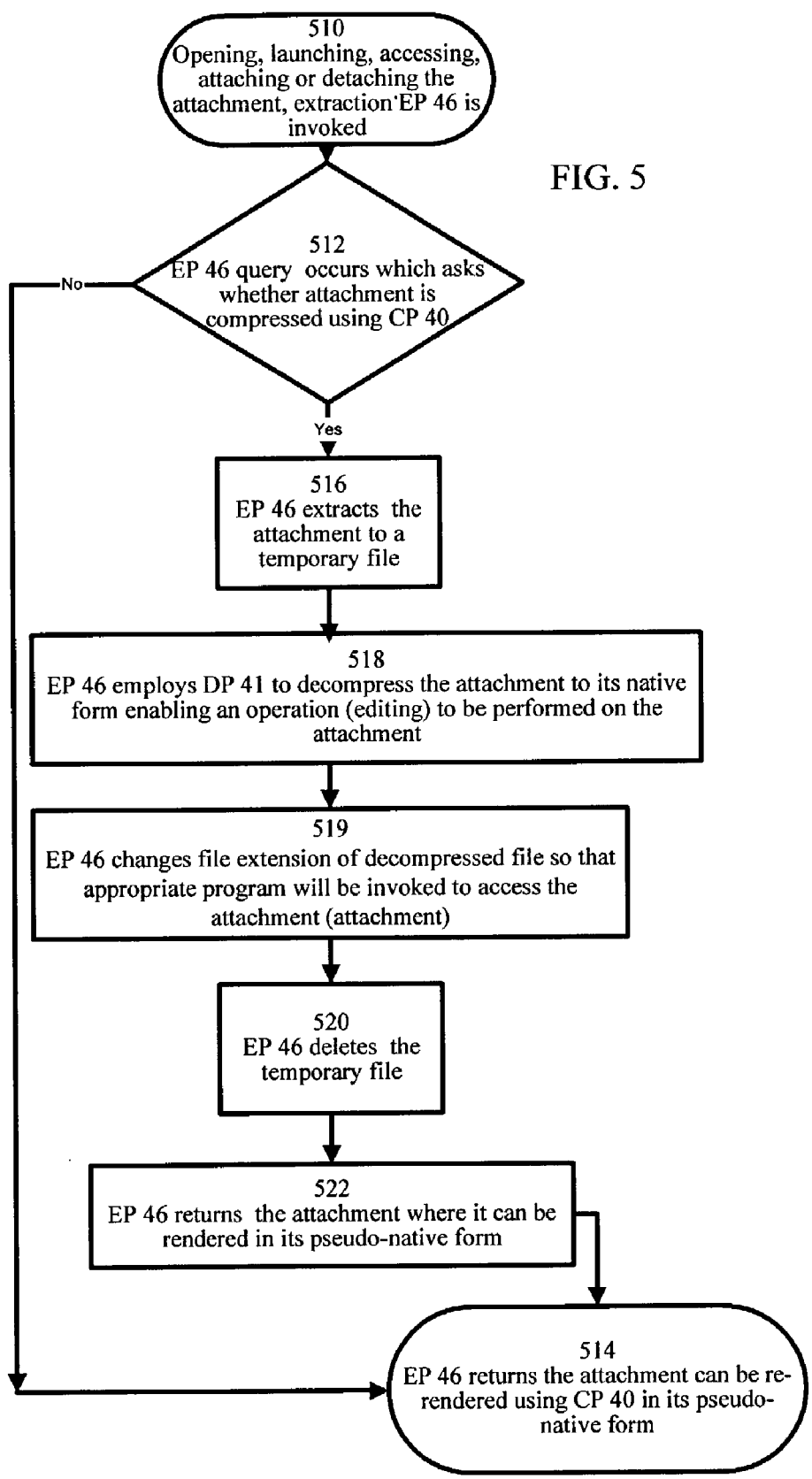
FIG. 5 is a flow chart of another yet operation of the present invention.
Figure 8:
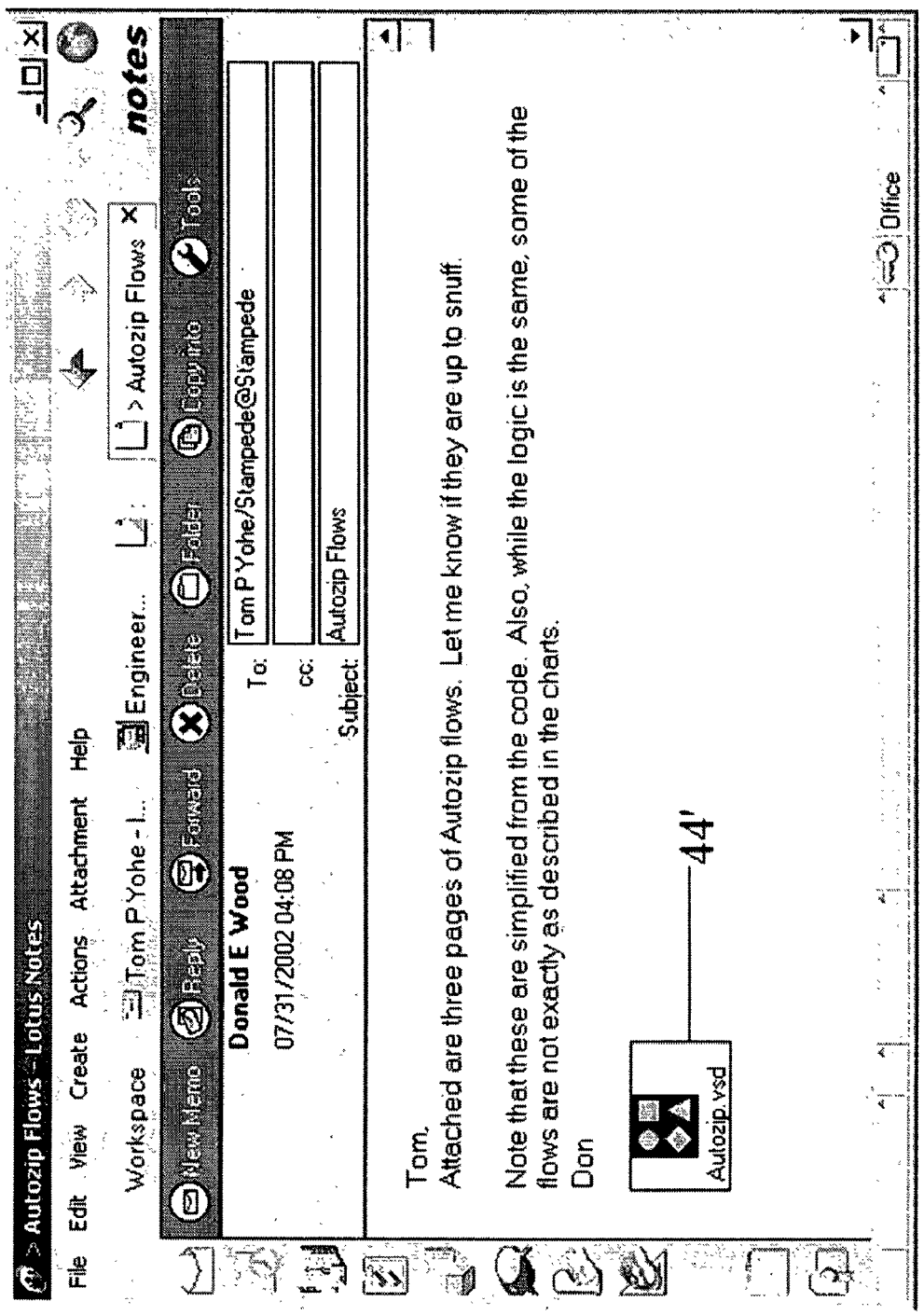
FIG. 8 is a screen shot showing a compressed file as rendered for view by a user with the aid of the present invention.

FIG. 8 is a screen shot showing a compressed file 44' as rendered by software 42 for view by a user with the aid of the present invention. Note, the file 44' is rendered in a pseudo native form. That is, the file is made to appear as if it is in its native form having an extension of ".vsd" though actually in a compressed form. As seen in FIG. 5, upon opening, launching, accessing, attaching or detaching the Attachment, extraction program (EP) 46 is invoked 510. EP 46 query 512 occurs which asks whether attachment is compressed using CP 40. If no, EP 46 returns 514 the attachment can be re-rendered using compression CP 40 in its pseudo-native form. If yes, EP 46 extracts 516 the attachment to a temporary file. The EP 46 employs 518 DP 41 to decompress the attachment to its native form enabling an operation (editing) to be performed on the attachment. EP 46 changes file extension of decompressed file so that appropriate program will be invoked to access the attachment. EP 46 deletes 520 the temporary file. The EP 46 returns 522 the attachment where it can be rendered in its pseudo-native form.

This allows the invoking of an associated program which permits access to the attachment (file object) having such extension (FIG. 6). In other words, though in its compressed form via ACP 38, the REP 42 asks 612 was attachment compressed by ACP 38? If no, program 42 returns 614 to RA 37. If yes, REP 42 changes the text file that describes the attachment by removing the file extension which depicts it as compressed. Note: This process repeats for each attachment associated with a document. Also, the purpose of REP 42 is to allow the presence of the attachment to be portrayed in a manner which is not confusing to the end user, i.e, if the extension which depicts the attachment as being compressed was displayed, the user would be confused as to why the icon does not match the extension name.

ACP 38 further provides for first determining whether the attachment is compressed. If the attachment is compressed, it saves/stores the attachment into the memory 18. If not compressed, ACP 38 determines whether compression savings is less than a predetermined percentage, say 5%, for example. If less than the predetermined percentage, then ACP 38 does not compress the attachment and stores/saves as is.

If greater than the predetermined percentage, the ACP 38 proceeds to compress the attachment and store/save the attachment in a compressed form with means for displaying the compressed form in its native (uncompressed format, such as a .doc file, .jpeg, etc.). Upon attempting to access the compressed form, the user is virtually displayed the compressed form in pseudo-native uncompressed format, while permitting the user to access or edit, for example, the attachment, in a virtually direct manner, i.e., the operations decompression is transparent to the user upon attempting to access the attachment and thus the rendering application was the only initiated step. Therefore, through the aid of ACP 38, the attachment is always virtually displayed in its native form, though it may be in compressed form.

In addition, the ACP 38 is automatically initiated upon composing data or an e-mail on the CPU 12 which associates the compressed data (i.e., attachment) with RA 37. This can be done, for example, when the compressed data is to be attached to the e-mail.

By virtue of the present invention, great savings of time and memory space is achieved. This is so because the compression of all data can be maximized. Further, savings are achieved by employing the software 38 on communicating servers and client machines. Further, ACP 38 is equipped with means to recognize when another machine has complementary ACP 38 thereon and thus can send data in a compressed form. This can be done through maintaining a recipient list or list of extensions which have ACP 38 thereon. If the intended recipient of a document is not on the list, then the ACP 38 sends the attachment in its native form or optionally a compressed form, such as a ZIP file, so that it may be decompressed using a conventional decompression utility.

Another aspect of the ACP 38 includes the ability to selectively permit attachment data which resides in one or more databases on the computer 12 to be automatically compressed using ACP 38 while other data entering non selected databases are not so done. ACP 38 further provides manual initiation of a scan and compress function, wherein the database is scanned for file attachments and upon location thereof are automatically compressed by ACP 38.

The above described embodiments are set forth by way of example and are not for the purpose of limiting the present invention. It will be readily apparent to those skilled in the art that obvious modifications, derivations and variations can be made to the embodiments without departing from the scope of the invention. Accordingly, the claims appended hereto should be read in their full scope including any such modifications, derivations and variations.

```
//
//                                      Appendix
//
// ----------------------------------------------------------------
// Structures used to pass the attachment rename information through the
// composite data enumeration
// ----------------------------------------------------------------
typedef struct
{
        BLOCKID         item_blockid;     // item block id being examined
        BLOCKID         value_blockid;    // value block id being examined
        DWORD           value_len;        // length of the value being examined
        int             growth;           // amount block is to grow
} HsBlockInfo;
#define MAX_HSBLOCKS 8                    // size of hotspot blocks array
typedef                                   struct
{
        int     blkindex;                 // index into hsBlocks array
        int     offset;                   // offset to data from start of the block
} HsInfoDetails;
struct   HotSpotInfo
{
  HsBlockInfo      hsBlocks[MAX_HSBLOCKS];  // blocks that hold the data of the hotspot
  HsInfoDetails    hsBegin,                 // blockid and offset to hot spot begin
  HsInfoDetails    hsGraphic;// blockid and offset to graphic describing size of the hotspot icon
  HsInfoDetails    hsMetaHeader;            // blockid and offset to hot spot meta file header
  HsInfoDetails    hsMetaSegment;           // blockid and offset to hot spot meta file segment(MFS)
  int       hsMetaSegmentSetWindowExt;      // offset from meta record to set window ext record in MFS
  int       hsMetaSegmentTextOut;           // offset from meta record to text out record in MFS
  int       hsMetaSegmentStretchBlt1;       // offset from meta record to 1st stretch blt record in MFS
  int       hsMetaSegmentStretchBlt2,       // offset from meta record to 2nd stretch blt record in MFS
  HsInfoDetails    hsMimePart;              // blockid and offset to the mime data
  HsInfoDetails    hsTextFileName;          // displayed file name when metaheader and MFS are missing
  HsInfoDetails    hsBitmapHeader;          // When there is no metaheader or MFS and no text file name
  HsInfoDetails    hsBitmapSegment;         // then the name is bitmapped in the icon
  HsInfoDetails    hsColorTable,            //    color table for the bitmap
  HsInfoDetails    hsPatternTable,          //    pattern table for the bitmap
};
struct HotSpotEnumeration
{
  NOTEHANDLE      hNote,                    // handle to note
  BOOL            addingExtension;          // extensions are being added (false means removal)
  char            *specificName;            // searching of a specific attachment, NULL means all
  void            *pCD                      // ptr to start of composite data record
  BOOLEAN         inHotSpot;                // processing in hotspot (used to track meta file records)
  BOOLEAN         bFixupRequired;           // a tgzipped attachment has unique name starting with ATT
  struct
  {
        BLOCKID    item_blockid,            // item block id being examined
```

```
                BLOCKID         value_blockid;          // value block id being examined
                DWORD           value_len;              // length of the value being examined
                int             offset;                 // offset to data from start of the block
    } lastBlkScanned;                                   // next scan will continue from this point
    struct HotSpotInfo *pHsInfo;                        // info about hotspot that was found
};
// ----------------------------------------------------------------
// Maintain a table of blocks that are needed to update the icon.
// The zero entry in the table is never used.
// // ----------------------------------------------------------------
int GetBlkIndex(HotSpotEnumeration *pHsEnum)
{
                int                             ii;
                HsBlockInfo                     *phsBlocks;
                for (ii = 1; ii < MAX_HSBLOCKS; ii++)
                {
                                // is it already in the table?
                                phsBlocks = &pHsEnum=>pHsInfo->hsBlocks[ii];
                                if (BlockIdsMatch(pHsEnum->lastBlkScanned.item_blockid, phsBlocks->item_blockid))
                                {
                                                // just return the index
                                                return(ii);
                                }
                                // is this an empty slot
                                if (ISNULLBLOCKID(phsBlocks->item_blockid))
                                {
                                                // not in the table so fill in a new entry and return the index
                                                phsBlocks->item_blockid = pHsEnum->lastBlkScanned.item_blockid;
                                                phsBlocks->value_blockid = pHsEnum->lastBlkScanned.value_blockid;
                                                phsBlocks->value_len = pHsEnum->lastBlkScanned.value_len;
                                                return(ii);
                                }
                }
                // not found and no room left (should not happen)
                return(0);
}
// ----------------------------------------------------------------
// Looks at composite data records for the tgzipped hotpsot information.
// Called from the composite data enumeration
//
// The composite data is locked, so do not re-allocate it in this routine
// ----------------------------------------------------------------
STATUS LNCALLBACK       (TgzLocateTgzippedHotSpot(char *cdRecord, WORD cdRecordType, DWORD cdRecordLen,
void *phsenum)
{
char                    #fileName,              // display name of the attachment
char                    *uniqueName,            // unique name of the attachment
int                     mrOffset,               // offset to hotspot from start of composite data
BOOL                    markit;                 // set if this one is to be changed
CDWINMETASEG            *pWinMetaSeg;
char                    *pEndMetaSeg,
METAHEADER              *pMetaHeader;
METARECORD              *pMetaRecord;
int                     stretchBltFnd = 0;
char                    szOldStyle[MAX_PATH];   // unqiue name converted to old style
STATUS                  Status = NOERROR;
CDHOTSPOTBEGIN *cdRec = (CDHOTSPOTBEGIN *)cdRecord;
struct HotSpotEnumeration *pHsEnum =                    // ptr to hotspot enumeration structure
                (struct HotSpotEnumeration *) phsenum;
pHsEnum->lastBlkScanned offset = (char *)cdRec – (char *)pHsEnum->pCD;
// Is this a HotSpot for a file attachment
if ((cdRecordType == SIG_CD_HOTSPOTBEGIN) && (cdRec->Type == HOTSPOTREC_TYPE_FILE))
{
                uniqueName = (char *)(cdRec + 1);
                // Do we want all or just a specific one?
                if (pHsEnum->specificName != NULL)
                {
                                // Only a specific record was requested
                                if (strcmp(pHsEnum->specificName, uniqueName) == 0)
                                {
                                                // This is the one
                                                pHsEnum->pHsInfo->hsBegin offset = pHsEnum->lastBlkScanned.offset;
                                                pHsEnum->pHsInfo->hsBegin blkindex = GetBlkIndex(pHsEnum);
                                                pHsEnum->inHotSpot = TRUE;
                                }
                                else
                                {
                                                // Check for old style unique name with angled brackets
                                                if (uniqueName[3] == '<>)
```

-continued

```
                    {
                      strcpy(szOldStyle, pHsEnum->specificName);
                      szOldStyle[3] = '<';
                      szOldStyle[12] = '>';
                      if (strcmp(szOldStyle, uniqueName) == 0)
                      {
                        // This is the one
                        pHsEnum->pHsInfo->hsBegin.offset = pHsEnum->lastBlkScanned.offset;
                        pHsEnum->pHsInfo->hsBegin.blkindex = GetBlkIndex(pHsEnum),
                        pHsEnum->inHotSpot = TRUE;
                      }
                    }
                  }
            else
            {
                    // Was this attachment marked to have an extension added to it?
                    fileName = uniqueName + strlen(uniqueName) + 1;
                    if ((strncmp(uniqueName, TGZ_UNIQUENAME_PREFIX, TGZ_UNIQUENAME_PREFIX_LEN) == 0)
                         ||(strncmp(uniqueName, TGZ_OLD_UNIQUENAME_PREFIX, TGZ_UNIQUENAME_PREFIX_LEN) == 0))
                    {
                      // Make sure the extension has not already been added or removed
                      markit = FALSE;
                      if (pHsEnum->addingExtension == TRUE)
                      {
                                if (strcmp(fileName + strlen(fileName) - 4, ".zip") != 0)
                                        markit = TRUE,
                      }
                      else
                      {
                        if (strcmp(fileName + strlen(fileName) - TGZIP_EXTENSION_LEN,
                                     TGZIP_EXTENSION) == 0)
                                        markit =TRUE;
                      }
                      if (markit == TRUE)
                      {
                        // Remember the offset to CDHOTSPOTBEGIN record for post processing
                        pHsEnum->pHsInfo->hsBegin.offset = pHsEnum->lastBlkScanned.offset;
                        pHsEnum->pHsInfo->hsBegin.blkindex = GetBlkIndex(pHsEnum);
                        pHsEnum->inHotSpot = TRUE,
                      }
                    }
                    else
                    {
                      // If we are either adding or removing extensions and the unique name
                      // starts with ATT
                      if ((pHsEnum->specificName == NULL)
                      && (strncmp(uniqueName, "ATT", 3) == 0))
                      {
                        // Determine if fixup is required, if so return so it can happen with the
                        // block unlocked
                        pHsEnum->bFixupRequired = TgzUniqueNameMismatchCheck(uniqueName, fileName,
pHsEnum);
                        if (pHsEnum->bFixupRequired == TRUE)
                                        Status = 2;
                      }
                    }
            }
      }
      if (pHsEnum->inHotSpot == TRUE)
      {
            switch(cdRecordType)
            {
            case SIG_CD_GRAPHIC:
                    // Remember where the Graphic item is
                    pHsEnum->pHsInfo->hsGraphic.offset = pHsEnum->lastBlkScanned.offset;
                    pHsEnum->pHsInfo->hsGraphic.blkindex = GetBlkIndex(pHsEnum);
                    break;
            case SIG_CD_WINMETAHEADER:
                    // Remember where the window meta header is
                    pHsEnum->pHsInfo->hsMetaHeader.offset = pHsEnum->lastBlkScanned.offset;
                    pHsEnum->pHsInfo->hsMetaHeader.blkindex = GetBlkIndex(pHsEnum);
                    break;
            case SIG_CD_WINMETASEG:
                    // Remember where metafile segment is
                    pHsEnum->pHsInfo->hsMetaSegment.offset = pHsEnum->lastBlkScanned.offset;
                    pHsEnum->pHsInfo->hsMetaSegment.blkindex = GetBlkIndex(pHsEnum);
                    // Loop,    looking for all metafile records needed to adjust the icon
                    pWinMetaSeg = (CDWINMETASEG *) cdRec;
                    pEndMetaSeg = (char *)pWinMetaSeg + pWinMetaSeg->DataSize;
```

```
                            pMetaHeader = (METAHEADER *)(pWinMetaSeg + 1);
                            pMetaRecord = (METARECORD *)(pMetaHeader + 1);
                            while ((char *)pMetaRecord < (char *)pEndMetaSeg)
                            {
                                    mrOffset = (char *)pMetaRecord - (char *)pMetaHeader;
                                    switch(pMetaRecord->rdFunction)
                                    {
                                    case META_TEXTOUT
                                            pHsEnum->pHsInfo->hsMetaSegmentTextOut = mrOffset,
                                            break;
                                    case META_SETWINDOWEXT:
                                            pHsEnum->pHsInfo->hsMetaSegmentSetWindowExt = mrOffset;
                                            break;
                                    case META_DIBSTRETCHBLT:
                                            if (stretchBltFnd == 0)
                                            {
                                              pHsEnum->pHsInfo->hsMetaSegmentStretchBlt1 = mrOffset;
                                              stretchBltFnd = 1;
                                            }
                                            else if (stretchBltFnd == 1)
                                            {
                                              pHsEnum->pHsInfo->hsMetaSegmentStretchBlt2 = mrOffset;
                                              stretchBltFnd = 2;
                                            }
                                            break;
                                    }
                                    pMetaRecord = (METARECORD *)((char *)pMetaRecord +
                                    (pMetaRecord->rdSize * sizeof (WORD)));
                            }
                            break;
                    case SIG_CD_TEXT
                    // Remember where the text is
                    // This is the displayed file name when metaheader and metasegment are not present
                            pHsEnum->pHsInfo->hsTextFileName.offset = pHsEnum->lastBlkScanned.offset;
                            pHsEnum->pHsInfo->hsTextFileName.blkindex = GetBlkIndex(pHsEnum);
                            break;
                    case SIG_CD_BITMAPHEADER:
                    // Remember where the bitmap header is
                    // The displayed file name is in the icon when metaheader and metasegment and the
                    // SIG_CD_TEXT are not present
                            pHsEnum->pHsInfo->hsBitmapHeader.offset = pHsEnum->lastBlkScanned.offset;
                            pHsEnum->pHsInfo->hsBitmapHeader.blkindex = GetBlkIndex(pHsEnum);
                            break,
                    case SIG_CD_BITMAPSEGMENT.
                    // Remember where the bitmap segment is
                    // The displayed file name is in the icon when metaheader and metasegment and the
                    // SIG_CD_TEXT are not present
                            pHsEnum->pHsInfo->hsBitmapSegment.offset = pHsEnum->lastBlkScanned.offset;
                            pHsEnum->pHsInfo->hsBitmapSegment blkindex = GetBlkIndex(pHsEnum);
                            break;
                    case SIG_CD_COLORTABLE.
                    // Remember where the color table is (only needed when bitmap has to be modified)
                            pHsEnum->pHsInfo->hsColorTable.offset = pHsEnum->lastBlkScanned.offset;
                            pHsEnum->pHsInfo->hsColorTable.blkindex = GetBlkIndex(pHsEnum);
                            break;
                    case SIG_CD_PATTERNTABLE:
                    // Remember where the pattern table is (only needed when bitmap has to be
                    // modified)
                            pHsEnum->pHsInfo->hsPatternTable.offset = pHsEnum->lastBlkScanned.offset;
                            pHsEnum->pHsInfo->hsPatternTable.blkindex = GetBlkIndex(pHsEnum);
                            break;
                    case BIG_CD_HOTSPOTEND.
                    // End of hot spot, so bump the index and clear the inHotSpot flag - nonzero
                    // status causes enum to stop
                            pHsEnum->inHotBpot = FALSE;
                            Status = 1;
                            break;
                    }
            }
            return(Status);
}
// ----------------------------------------------------------------
// Finds all hotspot records that need to be updated. Caller can ask for the
// next hotspot based on last found or the hotspot with a specific name.
// The addingExtension parameter is set to TRUE when caller will add the tgzip
// extension.
//
// To start from the beginning of the note set the hsEnum structure to zeroes.
// ----------------------------------------------------------------
```

```
-continued

STATUS FindHotSpot(NOTEHAHDLE hNote, BOOLEAN addingExtension, char *oldName, char *newName,
                                  struct HotSpotEnumeration *pHsEnum, struct HotSpotInfo *pHsInfo)
{
 STATUS          Status;
 WORD            value_datatype;
 struct MimePart *mimepart;
 char            *mimetext;
  char           *mimeattachment;
 char            *fileName;
 char            *mimeuniquename;
 int             oldNameLen;
 int             newNameLen;
 ActionRoutinePtr    lpTgzLocateTgzippedHotSpot;
 // Initialize the hot spot enumeration and info structures
 memset(pHsInfo, 0, sizeof(struct HotSpotInfo));
 pHsEnum->hNote = hNote;
 pHsEnum->addingExtension = addingExtension;
 pHsEnum->specificName = oldName;
 pHsEnum->inHotSpot = FALSE;
 pHsEnum->pHsInfo = pHsInfo;
lpTgzLocateTgzippedHotSpot = (ActionRoutinePtr)MakeProcInstance(TgzLocateTgzippedHotSpot.hInst);
 if (oldName != NULL)
 {
          oldNameLen = strlen(oldName),
          newNameLen = strlen(newName);
 }
rescan:
 // Locate the first item in the note
 Status = NSFItemInfo(hNote, NULL, 0, &pHsEnum->lastBlkScanned item_blockid, &value_datatype,
                         &pHsEnum->lastBlkScanned.value_blockid, &pHsEnum->lastBlkScanned.value_len);
 pHsEnum->lastBlkScanned.offset = 0;
 while (Status == NOERROR)
 {
          if (value_datatype == TYPE_COMPOSITE)
          {
          // Look through composite data for tgzipped hotspots
                   pHsEnum->pCD = OSLockBlock(char, pHsEnum->lastBlkScanned value_blockid);
                   if (pHsEnum->pCD != NULL)
                   {
                            Status = EnumCompositeBuffer(pHsEnum->lastBlkScanned.value_blockid,
                                       pHsEnum->lastBlkScanned.value_len,
                                        lpTgzLocateTgzippedHotSpot. pHsEnum),
                                OSUnlockslock(pHsEnum->lastBlkScanned.value_blockid);
                   }
                   // Check to see if tgz information was lost in the attachment
                   if (pHsEnum->bFixupRequired == TRUE)
                   {
                            // This is an unusual case. Fix it and start over
                            if (TgzUniqueNameMismatchFixup(pHsEnum) == TRUE)
                            {
                                   pHsEnum->bFixupRequired = FALSE,
                                   goto rescan;
                            }
                   }
          }
          // Mime part found and we are renaming the attachment
          if ((value_datatype == TYPE_MIME_PART) && (oldName != NULL))
          {
                   mimepart = OSLockBlock(struct MimePart, pHsEnum->lastBlkScanned.value_blockid);
                   if (mimepart != NULL)
                   {
                   // Locate the name
                            mimepart = (struct MimePart *)((char *)mimepart + 2);
                            mimetext = (char *)(mimepart + 1),
                      mimeattachment = strstr(mimetext, MIMEATTACHNENT);
                            if (mimeattachment != NULL)
                            {
                                       // This mime part has a name, does it match the one we want?
                                       mimeuniquename = mimetext + mimepart->totalLength – oldNameLen;
                                       if (strncmp(mimeuniquename, oldName, oldNameLen) == 0)
                                       {
                                                pHsInfo->hsMimePart.offset = pHsEnum->lastBlkScanned.offset;
                                                pHsInfo->hsMimePart.blkindex = GetBlkIndex(pHsEnum);
                                                Status = 1;
                                       }
                                       else
                                       {
                                                fileName = mimeattachment + strlen(MIMEATTACHMENT);
                                                if ((strncmp(fileName, newName, newNameLen) == 0) &&
```

-continued

```
                                                            (fileName[newNameLen] == '\"'))
                                                    {
                                                        pHsInfo->hsMimePart.offset =
                                                                    pHsEnum->lastBlkScanned.offset;
                                                        pHsInfo->hsMimePart.blkindex =
                                                                    GetBlkIndex(pHsEnum);
                                                        Status = 1;
                                                    }
                                                }
                                            }
                                        }
                                        OSUnlockBlock(pHsEnum->lastBlkScanned.value_blockid);
                                    }
                                }
                                if (Status == NOERROR)
                                {
// Either no hot spot found or part of it is in the next item, get the next item in the note
                                    Status = NSFItemInfoNext(hNote, pHsEnum->lastBlkScanned.item_blockid,
                                            NULL, 0,    &pHsEnum->lastBlkScanned.item_blockid,
                                            &value_datatype, &pHsEnum->lastBlkScanned.value_blockid,
                                            &pHsEnum->lastBlkScanned.value_len).
                                        pHsEnum->lastBlkScanned.offset = 0;
                                }
                            }
                            FreeProcInstance(lpTgzLocateTgzippedHotSpot);
                            if ((Status != NOERROR) && (Status != 1))
                                    Status = ERR_ITEM_NOT_FOUND;
                            return(Status);
}
// ---------------------------------------------------------------
// Removes the TGZIP_EXTENSION from one autozipped attachments
// ---------------------------------------------------------------
STATUS TgzRemoveOneTgzipExtension(NOTEHANDLE hNote, struct HotSpotInfo *pHsInfo)
{
    STATUS      Status = NOERROR;                           // status
    char        *cdStart;                                   // start of composite data
    char        *srcPtr;                                    // ptr to start of data to be moved
    char        *extPtr;                                    // ptr to where to add the .tgz.zip extension
    char        *destPtr;                                   // ptr to destination of the move
    char        *lastPos;                                   // ptr to last position of data
    int         len;                                        // amount of data to move
    int         textOutLen;                                 // length of string in text out meta record
    HsBlockInfo *pTmpBlkInfo;                               // temporary ptr to block info
    CDHOTSPOTBEGIN      *cdRec;                             // start of hotspot within composite data
    CDWINMETAHEADER     *pWinMetaHeader;                    // ptr to Notes windows meta header
    CDWINMETASEG        *pWinMetaSeg;                       // ptr to Notes windows meta segment
    CDGRAPHIC   *cdGraphic;                                 // ptr to graphic item
    CDTEXT      cdText;                                     // text record
    int         hotspotXratio;                              // ratio used to modify set window ext
    METAHEADER  *pMetaHeader,                               // ptr to Windows 3 1 style meta header
    METARECORD  *pMrTextOut;                                // ptr to text out meta record
    METARECORD  *pMrSetWindowExt;                           // ptr to set window ext meta record
    METARECORD  *pMrBlt1,                                   // ptr to DIB stretch Blt meta record
    METARECORD  *pMrBlt2;                                   // ptr to DIB stretch Blt meta record
    IconType_t  iconType;                                   // indicates whether or not the icon was modified
    char        *pCd;                                       // ptr in cd to read structures
    char        *pStart;                                    / start of data to be moved
            // Defensive checks
            iconType = IconNotModified,
            if ((pHsInfo->hsGraphic.blkindex != 0)      &&
            (pHsInfo->hsMetaHeader.blkindex != 0)       &&
            (pHsInfo->hsMetaSegment.blkindex != 0)      &&
            (pHsInfo->hsMetaSegmentTextOut != 0))
{
            TgzUpdateBitmap(hNote, pHsInfo, FALSE);
            // Update the notes windows meta header
            pTmpBlkInfo = &pHsInfo->hsBlocks[pHsInfo->hsMetaHeader.blkindex];
            cdStart = OSLockBlock(char, pTmpBlkInfo->value_blockid);
            pWinMetaHeader = (CDWINMETAHEADER *)(cdStart + pHsInfo->hsMetaHeader.offset);
            pWinMetaHeader->MetafileSize -= TGZIP_EXTENSION_LEN,
            pwinMetaHeader->OriginalDisplaySize.width -= TGZIP_EXTENSION_TWIPS;
            OSUnlockBlock(pTmpBlkInfo->value_blockid),
            // Modify the graphic to be smaller
            pTmpBlkInfo = &pHsInfo->hsBlocks[pHsInfo->hsGraphic.blkindex];
            cdStart = OSLockBlock(char, pTmpBlkInfo->value_blockid);
            cdGraphic = (CDGRAPHIC *)(cdStart + pHsInfo->hsGraphic.offset);
            if (cdGraphic->DestSize.width != 0)     // defensive check, should never be zero
            hotspotXratio = (TGZIP_EXTENSION_TWIPS = 100) / cdGraphic->DestSize.width;
            cdGraphic->DestSize.width -= TGZIP_EXTENSION_TWIPS;
            OSUnlockBlock(pTmpBlkInfo->value_blockid),
```

-continued

```
// Update the Meta Segment then the old windows 3.1 style meta header and meta records
        pTmpBlkInfo = &pHsInfo->hsBlocks[pHsInfo->hsMetaSegment.blkindex];
        cdStart = OSLockBlock(char, pTmpBlkInfo->value_blockid),
        pWinMetaSeg = (CDWINMETASEG *)(cdStart + pHsInfo->hsMetaSegment.offset);
        pWinMetaSeg->Header.Length -= TGZIP_EXTENSION_LEN;
        pWinMetaSeg->DataSize -= TGZIP_EXTENSION_LEN,
        pWinMetaSeg->SegSize -= TGZIP_EXTENSION_LEN;
        pMetaHeader = (METAHEADER *)(pWinMetaSeg + 1);
        pMetaHeader->ntSize -= TGZIP_EXTENSION_LEN / sizeof(WORD);
        if (pHsInfo->hsMetaSegmentSetWindowExt != 0)
        {
        // Modify the set window ext to prevent distortion of the icon (value is
        // approximated)
                    pMrSetWindowExt = (METARECORD *)
                                ((char *)pMetaHeader + pHsInfo->hsMetaSegmentSetWindowExt);
                    pMrSetWindowExt->rdParm[1] -=
                                ((pMrSetWindowExt->rdParm[1] * hotspotXratio) + 50) / 100;
        }
        if (pHsInfo->hsMetaSegmentStretchBlt1 != 0)
        {
                    // Modify the x destination offset for the icon
                    pMrBlt1 = (METARECORD *)((char *)pMetaHeader +
                                    pHsInfo->hsMetaSegmentStretchBlt1);
                    pMrBlt1->rdParm[9] -= 17;
        }
        if (pHsInfo->hsMetaSegmentStretchBlt2 != 0)
        {
                    // Modify the x destination offset for the icon's mask
                    pMrBlt2 = (METARECORD *)((char *)pMetaHeader
                                        + pHsInfo->hsMetaSegmentStretchBlt2);
                    pMrBlt2->rdParm[9] -= 17,
        }
        // Remove the tgzip extension from the name so it will not display in the icon
        pMrTextOut = (METARECORD *)((char *)pMetaHeader + pHsInfo->hsMetaSegmentTextOut);
        textOutLen = pMrTextOut->rdParm[0],
        pMrTextOut->rdSize -= TGZIP_EXTENSION_LEN / sizeof(WORD);
        pMrTextOut->rdParm[0] = textOutLen - TGZIP_EXTENSION_LEN;
        // Remove the extension from the icon
        extPtr = ((char *)&pMrTextOut->rdParm[1]) + textOutLen;
        destPtr = extPtr - TGZIP_EXTENSION_LEN;
        lastPos = cdStart + pTmpBlkInfo->value_len;
        memmove(destPtr, extPtr, lastPos - extPtr);
        OSUnlockBlock(pTmpBlkInfo->value_blockid);
        iconType = IconMeta;
}
else if (pHsInfo->hsTextFileName.blkindex != 0)
{
        // Modify the file name in the text record of the hotspot
        pTmpBlkInfo = &pHsInfo->hsBlocks[pHsInfo->hsTextFileName.blkindex];
        cdStart = OSLockBlock(char, pTmpBlkInfo->value_blockid);
        pStart = pCd = cdStart + pHsInfo->hsTextFileName.offset;
        ODSReadMemory(&pCd, _CDTEXT, &cdText, 1);
        // Remove the tgzip extension by moving data
        srcPtr = pStart + cdText Header.Length;
        destPtr = srcPtr - TGZIP_EXTENSION_LEN;
        lastPos = cdStart + pTmpBlkInfo->value_len;
        memmove(destPtr, srcPtr, lastPos - srcPtr);
        // Update the length
        cdText Header.Length -= TGZIP_EXTENSION_LEN,
        ODSWriteMemory(&pStart, _CDTEXT, &cdText, 1);
        OSUnlockBlock(pTmpBlkInfo->value_blockid);
        iconType = IconText;
}
else if ((pHsInfo->hsGraphic blkindex != 0)           &&
                    (pHsInfo->hsBitmapHeader.blkindex != 0)          &&
                    (pHsInfo->hsBitmapSegment.blkindex != 0))
{
        // File name is in the bitmap
        iconType = IconBitmap;
        TgzUpdateBitmap(hNote, pHsInfo, FALSE);
}
// Determine where the filenames are
pTmpBlkInfo = &pHsInfo->hsBlocks[pHsInfo->hsBegin blkindex];
cdStart = OSLockBlock(char, pTmpBlkInfo->value_blockid)
cdRec = (CDHOTSPOTBEGIN *) (cdStart + pHsInfo->hsBegin.offset),
srcPtr = ((char *)(cdRec + 1)),
// Skip over the unique name and then to the end of the file name
srcPtr += strlen(srcPtr) + 1;
srcPtr + strlen(srcPtr);
```

-continued

```
destPtr = srcPtr - TGZIP_EXTENSION_LEN,
// Adjust the length fields of the composite data
cdRec->DataLength -= TGZIP_EXTENSION_LEN;
cdRec->Header Length -= TGZIP_EXTENSION_LEN;
// Remove the tgzip extension
lastPos = cdStart + pTmpBlkInfo->value_len;
len = lastPos - srcPtr,
memmove(destPtr, srcPtr, len);
OSUnlockBlock(pTmpBlkInfo->value_blockid),
if  (iconType == IconMeta)
{
        // Realloc meta segment item smaller
        pTmpBlkInfo = &pHsInfo->hsBlocks[pHsInfo->hsMetaSegment.blkindex];
        pTmpBlkInfo->value_len -= TGZIP_EXTENSION_LEN;
        if  (pHsInfo->hsMetaSegment.blkindex != pHsInfo->hsBegin.blkindex)
        {
                Status = NSFItemRealloc(pTmpBlkInfo->item_blockid,
                                                    &pTmpBlkInfo->value_blockid,
                                                    pTmpBlkInfo->value_len);
        }
}
else if  (iconType == IconText)
{
        // Realloc text file name item smaller
        pTmpBlkInfo = &pHsInfo->hsBlocks[pHsInfo->hsTextFileName.blkindex];
        pTmpBlkInfo->value_len -= TGZIP_EXTENSION_LEN;
        if  (pHsInfo->hsTextFileName.blkindex != pHsInfo->hsBegin.blkindex)
        {
                Status = NSFItemRealloc(pTmpBlkInfo->item_blockid,
                                        &pTmpBlkInfo->value_blockid,
                                        pTmpBlkInfo->value_len),
        }
}
// Realloc hotspot begin item smaller
pTmpBlkInfo = &pHsInfo->hsBlocks[pHsInfo->hsBegin.blkindex];
pTmpBlkInfo->value_len -= TGZIP_EXTENSION_LEN;
Status = NSFItemRealloc(pTmpBlkInfo->item_blockid,
                                    &pTmpBlkInfo->value_blockid,
                                    pTmpBlkInfo->value_len);
        return(Status),
}
// ----------------------------------------------------------------
// Removes the TGZIP_EXTENSION from all autozipped attachments
// ----------------------------------------------------------------
STATUS TgzRemoveTgzipExtensions(NOTEHANDLE hNote)
{
        struct HotSpotEnumeration hsEnum,          // struct passed to find offsets for renaming
        struct HotSpotInfo hsInfo;                 // struct passed to find offsets for renaming
        STATUS Status = NOERROR;                   // status
        // Early exit if there are no attachments
        if (NSFItemIsPresent(hNote, ITEM_NAME_ATTACHMENT, strlen(ITEM_NAME_ATTACHMENT)) == FALSE)
                return(ERR_EM_CONTINUE),
        // Leave if autozip is not allowed
        if (pCtab->bAllowAutozip == FALSE)
                return(ERR_EM_CONTINUE);
        // Remove the TGZ_INFO item, If found it is just left over from when the last
        // set of attachments were added. We want to start with it empty.
        NSFItemDelete(hNote, TGZ_INFO, TGZ_INFO_LEN);
        TGZIP_LOG("Removing extensions from attachments\n"),
        // Look for the next hot spot
        memset(&hsEnum, 0, sizeof (hsEnum)),
        while (FindHotSpot(hNote, FALSE, NULL, NULL, &hsEnum, &hsInfo) == 1)
        {
                Status = TgzRemoveOneTgzipExtension(hNote, &hsInfo),
        }
        return(Status);
}
```

What is claimed is:

1. A system for selectively and automatically compressing and decompressing data in a manner such that the data file can be rendered in a pseudo-native form and such that a rendering application program can be invoked by the system, which includes:

a first computer-based device having software thereon with means for determining whether a data file is one of a native uncompressed form and compressed form upon one of attaching, detaching, receiving, rendering and accessing said data file, means for transparently rendering an attachment with a .zip extension to a viewer in a pseudo-native form upon receipt of said attachment by dynamically manipulating said data file using said software to remove said .zip extension such that said first computer-based device can transparently access said data file, wherein said attachment remains compressed and rendered to appear as being in a native-uncompressed form without said .zip extension and without having to invoke a decompression utility.

2. The system of claim 1, which further includes sender determining means for determining whether to send said data file to a second computer-based device in one of a compressed form and native uncompressed form.

3. The system of claim 2, wherein said sender determining means includes software means for automatically determining whether said second computer-based device is equipped with means for decompressing said attachment.

4. The system of claim 1, wherein said software is automatically initiated upon composing a data file on said first computer based device.

5. The system of claim 1, wherein said software is automatically initiated upon composing an e-mail on said first computer based device.

6. The system of claim 1, which includes means for compressing said native uncompressed form of said data file into an attachment.

7. The system of claim 6, wherein said compressing means is further characterized to selectively compress said data file upon a compression of said data file resulting in a system savings of a predetermined percentage.

8. The system of claim 6, wherein said compression means compresses said data file in a manner to permit opening thereof by an industry standard decompression application program.

* * * * *